US008461029B2

(12) United States Patent  
Jiang et al.

(10) Patent No.: US 8,461,029 B2  
(45) Date of Patent: Jun. 11, 2013

(54) METHOD FOR FABRICATING INGAN-BASED MULTI-QUANTUM WELL LAYERS

(75) Inventors: Fengyi Jiang, Nanchang (CN); Li Wang, Nanchang (CN); Chunlan Mo, Nanchang (CN); Wenqing Fang, Nanchang (CN)

(73) Assignee: Lattice Power (JIANGXI) Corporation, Nanchang (CN)

( * ) Notice: Subject to any disclaimer, the term of this patent is extended or adjusted under 35 U.S.C. 154(b) by 0 days.

(21) Appl. No.: 13/566,616

(22) Filed: Aug. 3, 2012

(65) Prior Publication Data

US 2012/0295422 A1 Nov. 22, 2012

Related U.S. Application Data

(62) Division of application No. 13/059,031, filed on Feb. 14, 2011, now abandoned.

(30) Foreign Application Priority Data

Aug. 19, 2008 (WO) ................ PCT/CN2008/001488

(51) Int. Cl.
*H01L 21/0254* (2006.01)
(52) U.S. Cl.
USPC .............................. 438/493; 438/507; 257/14
(58) Field of Classification Search
CPC ................ H01L 29/15; H01L 21/02455; H01L 21/02458; H01L 21/0254
USPC ................................................. 438/493, 507
See application file for complete search history.

(56) References Cited

U.S. PATENT DOCUMENTS

| 6,233,265 | B1 | 5/2001 | Bour |
| 2004/0227152 | A1* | 11/2004 | Biwa et al. ................ 257/103 |
| 2006/0169990 | A1 | 8/2006 | Taki |
| 2008/0124827 | A1 | 5/2008 | Huang |
| 2008/0258151 | A1* | 10/2008 | Kim ............................... 257/76 |

OTHER PUBLICATIONS

Lu, Shu, et al., "Phase Separation of InGaN films Grown by MOCVD", Chinese Journal of Semiconductors, Mar. 2004, vol. 25, No. 3, pp. 279-283.
Jiang, Fengyi, et al., "InGaN Films grown by Metalorganic Chemical Vapor Deposition", Acta Optical Sinica, Dec. 2001, vol. 21, No. 12, pp. 1463-1466.
Gerthsen, D et. al., "InGaN Composition and Growth Rate During the Early Stages of Metalorganic Chemical Vapor Deposition", Applied Physics Letters, Oct. 15, 2001, vol. 79, No. 16, pp. 2552-2554.

\* cited by examiner

*Primary Examiner* — Eva Y Montalvo
(74) *Attorney, Agent, or Firm* — Shun Yao; Park, Vaughan, Fleming & Dowler LLP

(57) ABSTRACT

A method for fabricating quantum wells by using indium gallium nitride (InGaN) semiconductor material includes fabricating a potential well on a layered group III-V nitride structure at a first predetermined temperature in a reactor chamber by injecting into the reactor chamber an In precursor gas and a Ga precursor gas. The method further includes, subsequent to the fabrication of the potential well, terminating the Ga precursor gas, maintaining a flow of the In precursor gas, and increasing the temperature in the reactor chamber to a second predetermined temperature while adjusting the In precursor gas flow rate from a first to a second flow rate. In addition, the method includes annealing and stabilizing the potential well at the second predetermined temperature while maintaining the second flow rate. The method also includes fabricating a potential barrier above the potential well at the second predetermined temperature while resuming the Ga precursor gas.

11 Claims, 3 Drawing Sheets

METHOD FOR FABRICATING INGAN-BASED MULTI-QUANTUM WELL LAYERS

RELATED APPLICATION

This application is a divisional application of Application No. 13/059,031, entitled "METHOD FOR FABRICATING InGaN-BASED MULTI-QUANTUM WELL LAYERS," by inventors Fengyi Jiang, Li Wang, Chunlan Mo, and Wenqing Fang, filed 14 Feb. 2011.

BACKGROUND

1. Field of the Invention

The present invention relates to the manufacturing of semiconductor light-emitting devices using indium gallium nitride (InGaN) semiconductor material. More specifically, the present invention relates to a technique for epitaxially growing high-quality semiconductor material with a multi-quantum well (MQW) structure.

2. Related Art

Group III-V nitride compounds (e.g., GaN, InN, and AlN) and alloy-compounds (e.g., AlGaN, InGaN, and AlGAlnN) have demonstrated efficient luminescence in the blue-green spectrum. This efficiency has been the driving force for their recent application in light-emitting diodes (LEDs) and laser diodes, which in turn has changed the market for color displays. Using group III-V nitride materials for high-brightness LEDs has opened the door to many applications previously deemed unfeasible, such as in traffic lights and in flat-panel display as white light sources. In addition, ultra-violet laser diodes using group III-V nitride materials are now widely used in scientific instrumentation, laboratories, and commercial products.

The active region of an LED is the area where light is generated. It typically includes a multi-quantum well (MQW) structure, which includes multiple periods of quantum well structures. A single quantum well structure may include, for example, an indium gallium nitride (InGaN)-based potential well (well) sandwiched between potential barriers (barriers) based on gallium nitride (GaN) or aluminum gallium nitride (AlGaN) materials. Carriers are trapped in the well between the barriers. An MQW structure allows higher carrier density and hence increases the carrier recombination rate. The faster the carriers recombine, the more efficient a light-emitting device becomes.

One of the factors that determine the color of the light emitted by an LED is the concentration of indium (In) in the MQW structure. Specifically, the color of the light emitted by an LED can vary with different InGaN concentration or InGaN-to-GaN ratios in the MQW structure. The higher the concentration of In or InGaN-to-GaN ratio, the longer the wavelength of the visible light. For instance, an LED emitting green light may exhibit a higher concentration of In in the MQW structure than one emitting blue light because the wavelength of green light is longer than that of blue light. One of the challenges of producing light with longer wavelengths is to increase the concentration of In in the MQW structure while maintaining the quality of the MQW structure.

Typically, the LED-fabrication process involves subjecting the structure to a relatively high temperature to obtain a high-quality MQW structure. In a conventional method, the InGaN well in an MQW structure is grown at a moderate temperature to increase the concentration of In, and the temperature is subsequently raised at least 100° C. for the growth of GaN barriers.

The temperature for fabricating an MQW structure is ideally lower than 800° C. to avoid the breaking of the indium-nitrogen bond in the InGaN well. However, fabricating an MQW structure at a lower temperature could result in a low-quality MQW structure.

SUMMARY

One embodiment of the present invention provides a method for fabricating an active region comprising at least one quantum well by using indium gallium nitride (InGaN) semiconductor material. The method includes fabricating a potential well on a layered group III-V nitride structure at a first predetermined temperature in a reactor chamber by injecting into the reactor chamber an In precursor gas and a Ga precursor gas. The method further includes, subsequent to the fabrication of the potential well, terminating the Ga precursor gas, maintaining a flow of the In precursor gas, and increasing the temperature in the reactor chamber to a second predetermined temperature while adjusting the In precursor gas flow rate from a first to a second flow rate. In addition, the method includes annealing and stabilizing the potential well at the second predetermined temperature while maintaining the second flow rate. The method also includes fabricating a potential barrier above the potential well at the second predetermined temperature while resuming the Ga precursor gas.

In a variation of this embodiment, the layered group III-V nitride structure includes a substrate, a buffer layer; and an n-type semiconductor layer.

In a variation of this embodiment, the first predetermined temperature is between 700° C. and 950° C.

In a variation of this embodiment, fabricating the potential well involves maintaining the In and Ga precursor flows for 50 to 200 seconds.

In a variation of this embodiment, the In precursor gas is TMIn.

In a further variation, fabricating the potential well includes injecting the TMIn gas at a flow rate that is between 160 and 360 sccm.

In a variation of this embodiment, the Ga precursor gas is TMGa, and fabricating the potential well includes injecting the TMGa gas at a flow rate that is between 0.4 and 2.4 sccm.

In a variation of this embodiment, the second predetermined temperature is between 830° C. and 1050° C.

In a variation of this embodiment, the first flow rate of the In precursor gas is between 25 and 100 sccm.

In a variation of this embodiment, the second flow rate of the In precursor gas is between 50 and 300 sccm.

In a variation of this embodiment, the increasing to the second predetermined temperature is performed over 25 to 400 seconds.

BRIEF DESCRIPTION OF THE FIGURES

The drawings accompanying and forming part of this specification are included to depict certain aspects of the invention. The invention may be better understood by reference to one or more of these drawings in combination with the description presented herein. It should be noted that the features illustrated in the drawings are not necessarily drawn to scale.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the present invention. Thus, the present invention is not limited to the embodiments shown, but is to be accorded the widest scope consistent with the claims.

Overview

Embodiments of the present invention provide a method for epitaxially fabricating a high-quality multi-quantum well (MQW) structure using InGaN semiconductor material. Tri-methylindium (TMIn) is used as the source for In. A light-emitting diode (LED) manufactured with the aforementioned MQW structure emits blue and green lights with high luminance efficiency.

Figure 1:
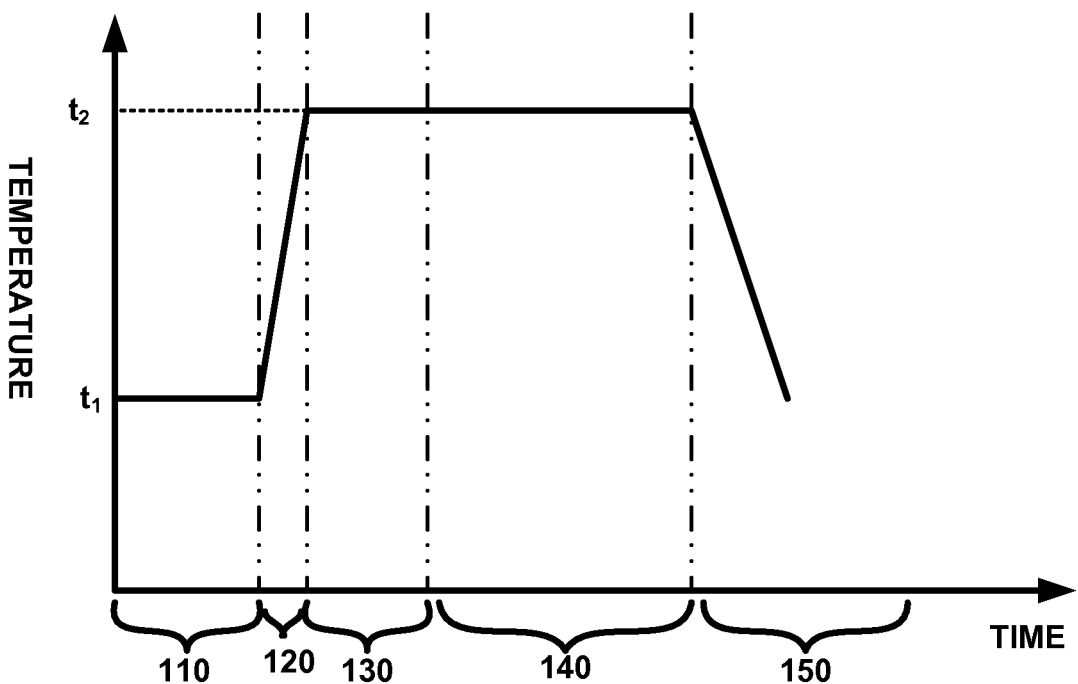
FIG. 1 is a typical temperature vs. time diagram of a process for growing a single InGaN/GaN quantum well structure.

FIG. 1 is a typical temperature vs. time diagram of a process for growing a single InGaN/GaN quantum well structure. This process is divided into five periods, denoted as periods 110, 120, 130, 140, and 150, respectively. An InGaN well is grown during period 110 at temperature $t_1$. Subsequently, during period 120, the temperature is raised from $t_1$ to $t_2$. The quantum well grown in period 110 is then annealed and stabilized at temperature $t_2$ during period 130. Next, a GaN barrier is grown during period 140 at temperature $t_2$. The temperature is subsequently lowered during period 150 in preparation of the growth of another quantum well or other structures.

Figure 2:
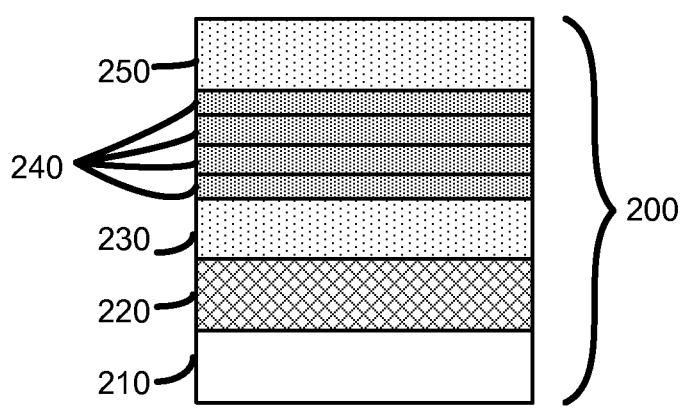
FIG. 2 illustrates a cross-section view of an exemplary LED which includes an InGaN/GaN MQW structure fabricated in accordance with one embodiment.

FIG. 2 illustrates a cross-section view of an exemplary LED which includes an InGaN/GaN MQW structure fabricated in accordance with one embodiment. An LED 200 includes a substrate 210, a buffer layer 220, a group III-V nitride n-type layer 230, an MQW active region 240, and a group III-V nitride p-type layer 250. MQW active region 240 includes a number (e.g., 4) of quantum wells. In one embodiment, a respective quantum well includes an InGaN-based potential well and a GaN-based potential barrier, which constitute a period in MQW active region 240. MQW active region 240 is fabricated using an In-rich fabrication method in accordance with one embodiment.

Figure 3:
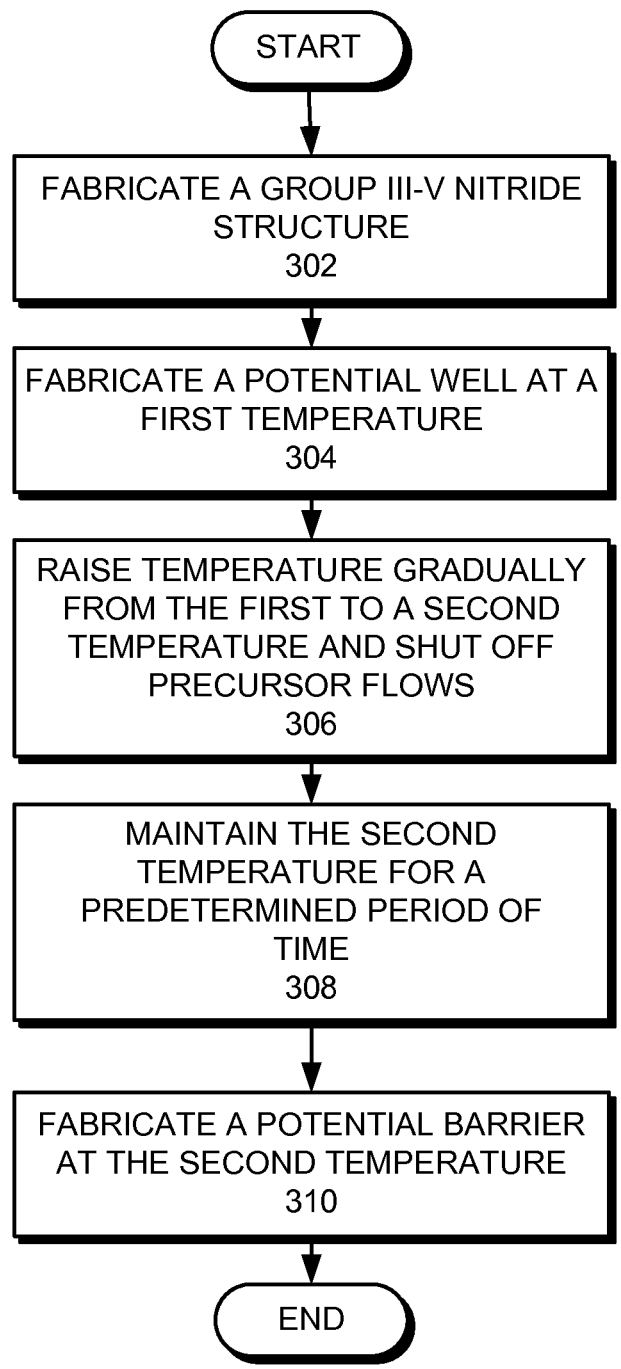
FIG. 3 presents a flow chart illustrating a conventional process for fabricating an active region of a GaN-based LED.

FIG. 3 presents a flow chart illustrating a conventional process for fabricating an active region of a GaN-based LED. The fabrication process includes a number of operations (302-310). In operation 302, a layered group III-V nitride structure is first fabricated on a substrate in a reactor chamber. The layered structure can include a buffer layer and a group III-V nitride n-type layer.

An active region with one or more quantum wells is fabricated on top of the n-type layer. Operations 304, 306, 308, and 310, described below, illustrate a conventional process for fabricating one quantum-well period. For an active region with n quantum-well periods, these operations are repeated n times. Each quantum-well period in an MQW structure can be grown under substantially similar or different epitaxial conditions.

In operation 304, a potential well is fabricated in a reactor chamber at a temperature higher than 720° C. but lower than 800° C. for 150 seconds, which corresponds to period 110 in FIG. 1. Note that nitrogen is used as the carrier gas and TMIn and trimethylgallium (TMGa) are used as precursors. The flow rate of TMIn is 260 standard cubic centimeters per minute (sccm) and that of TMGa is 1.4 sccm.

In operation 306, the temperature in the reactor chamber is gradually raised from 800° C. to 950° C., which corresponds to period 120 in FIG. 1. The semiconductor material remains in the chamber at 950° C. for 100 seconds. After the completion of the fabrication of the potential well, the precursor flows are shut off, but the carrier gas flow remains on.

In operation 308, the temperature in the reactor chamber remains at 950° C. for approximately 60 seconds, which corresponds to 130 in FIG. 1. This 60-second settling time stabilizes the quantum well structure and prevents defect formation in the structure.

In operation 310, a GaN barrier is epitaxially grown under 950° C. for approximately 60 seconds. The flow of TMGa is turned on and the flow rate is increased from 1.4 to 8 sccm. Note that the active region fabricated using the conventional method when forward-biased can produce visible light with a wavelength of approximately 470 nm. The temperature is reduced when operation 310 is completed. After operations 304 to 310 are repeated for a predetermined number of times, a group III-V p-type nitride layer is then formed above the active region, and ohmic contacts are constructed.

In the conventional method, the precursor flows are shut off in operation 306, but the carrier gas flow remains on after the completion of the fabrication of the potential well. Meanwhile, during the annealing process, the fabricated InGaN semiconductor material is exposed in a temperature that is 100° C. higher than the initial growth temperature. This higher temperature can break the In—N bond in the potential well, which results in the vaporization of In. Consequently, the concentration of In is reduced. Although increasing the ratio of In to Ga can increase the concentration of In, the effect is minimal, because during the subsequent annealing process a substantial amount of In can still escape from the grown potential well.

Embodiments of the present invention allow a high In concentration to be maintained in an InGaN-based potential well. In one embodiment, In is fabricated at a relatively low temperature. The structure subsequently undergoes an annealing process in an In-rich environment at a higher temperature. During the annealing process, the precursor flow of TMIn remains on. The flow rate of TMIn is predetermined based on the desired color of the emitted light.

Figure 4:
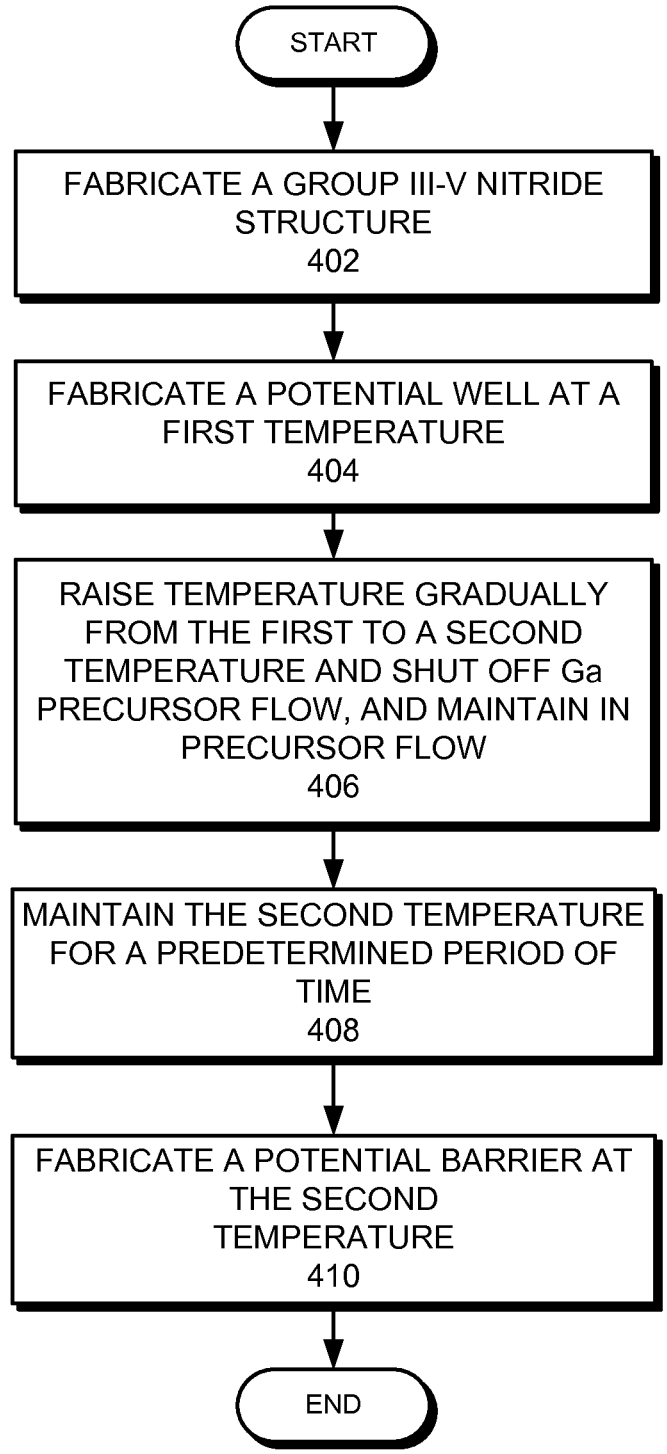
FIG. 4 presents a flow chart illustrating a process for fabricating an active region of a GaN-based LED in accordance with one embodiment.

FIG. 4 presents a flow chart illustrating a process for fabricating an active region of a GaN-based LED in accordance with one embodiment. The fabrication process includes a number of operations (402-410). In operation 402, a buffer layer and a group III-V nitride n-type layer are grown in the same manner as shown in FIG. 3. An active region with one or more quantum wells is formed on top of the n-type layer. Operations 404, 406, 408, and 410, described below, illustrate a process for fabricating one quantum-well period. For an active region with n quantum-well periods, these operations are repeated n times. Each quantum-well period in an MQW structure can be grown under substantially similar or different epitaxial conditions.

In operation 404, a potential well of an MQW structure is fabricated at a first temperature for a period of time, using a precursor gas that is rich in In (e.g., TMIn). In one embodiment, the first temperature is higher than that in operation 304 of the conventional method. As a result, the embodiments of present invention yield a better-quality well, compared with that fabricated using the conventional method.

In operation 406, the Ga precursor flow is stopped after the well is fabricated. However, the In precursor flows continue while the temperature in the reactor chamber is gradually increased to a second temperature. In one embodiment, the flow rate of TMIn increases gradually at a predetermined rate so as to reduce the rate of the vaporization of In. In one embodiment, the flow rate increases from 100 to 300 ml/min.

In operation 408, the semiconductor structure remains in the reactor chamber at the second temperature for a period of time in order for the fabricated material to anneal and stabilize. The TMIn flow continues at a predetermined rate and the Ga precursor flow remains off In operation 410, a potential barrier is grown at the second temperature for a period of time. The TMGa flow is turned on and the flow rate is set at a higher rate than that for fabricating the well. The temperature in the reactor chamber is subsequently lowered in preparation of the growth of the next quantum-well period of other structures.

EXAMPLE

An exemplary embodiment of fabricating an active region of a GaN-based LED is presented. After a layered group III-V nitride structure, including a group III-V nitride layer, is fabricated on a substrate, an active region with five quantum wells is fabricated on top of the n-type layer. Operations for growing a quantum-well period, described below, are repeated five times.

An InGaN potential well of a MQW structure is epitaxially grown in a reactor chamber at a growth temperature of approximately 830° C. for approximately 150 seconds. The first temperature is higher than that in a conventional method. This higher temperature results in a better-quality quantum well, compared with that fabricated using the conventional method. Nitrogen is used as the carrier gas, and TMIn and TMGa are used as precursors. The flow rate of TMIn is approximately 260 sccm and that of TMGa is approximately 1.4 sccm.

The temperature in the reactor chamber is gradually raised from 830° C. to approximately 950° C. The semiconductor material remains in the chamber at 950° C. for approximately 100 seconds. The TMGa flow is shut off, but the flow rate of TMIn is increased gradually from 50 to 150 sccm so as to reduce the rate of the vaporization of In.

The reactor chamber remains at 950° C. for approximately 60 seconds for the fabricated material to anneal and stabilize. This 60-second settling time stabilizes the MQW structure and prevents defect formation. The flow of TMIn continues at 150 sccm while TMGa remains off After the completion of the InGaN potential well, a GaN barrier is epitaxially grown at 950° C. for approximately 60 seconds. The flow of TMGa is turned on and the flow rate is set at 8 sccm. The fabricated active region produces light with a wavelength of approximately 470 nm and with a power output of 7 mW. Subsequently, the temperature in the reactor chamber is lowered in preparation for the growth of the next quantum-well period.

The invention is illustrated with different embodiments, described in detail, and with examples for purposes of facilitating the implementation of the different features or components of the invention. However, it is not the intent of the inventors to limit the application of the invention to the details shown. Modification of the features or components of the invention can be made without deviating from the spirit of the invention and thus still remains within the scope of the appended claims.

What is claimed is:

1. A method for fabricating an active region comprising at least one quantum well by using indium gallium nitride (InGaN) semiconductor material, the method comprising:
   fabricating a potential well on a layered group III-V nitride structure at a first predetermined temperature in a reactor chamber by injecting into the reactor chamber an In precursor gas and a Ga precursor gas;
   subsequent to the fabrication of the potential well, terminating the Ga precursor gas, maintaining a flow of the In precursor gas, and increasing the temperature in the reactor chamber to a second predetermined temperature while adjusting the In precursor gas flow rate from a first to a second flow rate;
   annealing and stabilizing the potential well at the second predetermined temperature while maintaining the second flow rate; and
   fabricating a potential barrier above the potential well at the second predetermined temperature while resuming the Ga precursor gas.

2. The method of claim 1, wherein the layered group III-V nitride structure comprises a substrate, a buffer layer; and an n-type semiconductor layer.

3. The method of claim 1, wherein the first predetermined temperature is between 700° C. and 950° C.

4. The method of claim 1, wherein fabricating the potential well involves maintaining the In and Ga precursor flows for 50 to 200 seconds.

5. The method of claim 1, wherein the In precursor gas is TMIn.

6. The method of claim 5, wherein fabricating the potential well comprises injecting the TMIn gas at a flow rate that is between 160 and 360 sccm.

7. The method of claim 1, wherein the Ga precursor gas is TMGa, and fabricating the potential well comprises injecting the TMGa gas at a flow rate that is between 0.4 and 2.4 sccm.

8. The method of claim 1, wherein the second predetermined temperature is between 850° C. and 1050° C.

9. The method of claim 1, wherein the first flow rate of the In precursor gas is between 25 and 100 sccm.

10. The method of claim 1, wherein the second flow rate of the In precursor gas is between 50 and 300 sccm.

11. The method of claim 1, wherein the increasing to the second predetermined temperature is performed over 25 to 400 seconds.

* * * * *